United States Patent
Chien et al.

(10) Patent No.: US 8,217,801 B2
(45) Date of Patent: Jul. 10, 2012

(54) LED (LIGHT EMITTING DIODE) MODULE

(75) Inventors: Wen-Hsiang Chien, Taipei Hsien (TW); Jyun-Wei Huang, Taipei Hsien (TW)

(73) Assignee: Advanced Connectek Inc., Taipei Hsien (TW)

( * ) Notice: Subject to any disclaimer, the term of this patent is extended or adjusted under 35 U.S.C. 154(b) by 329 days.

(21) Appl. No.: 12/572,507

(22) Filed: Oct. 2, 2009

(65) Prior Publication Data

US 2010/0148984 A1 Jun. 17, 2010

(30) Foreign Application Priority Data

Dec. 11, 2008 (TW) .............................. 97148205 A

(51) Int. Cl.
*G08B 5/22* (2006.01)

(52) U.S. Cl. ................................................. 340/815.45

(58) Field of Classification Search .............. 340/4.1, 340/815.45; 455/18; 362/249.07, 133, 249.02
See application file for complete search history.

(56) References Cited

U.S. PATENT DOCUMENTS

| | | | | |
|---|---|---|---|---|
| 3,668,526 | A * | 6/1972 | Raskin | 455/18 |
| 6,299,337 | B1 * | 10/2001 | Bachl et al. | 362/545 |
| 7,064,674 | B2 * | 6/2006 | Pederson | 340/815.45 |
| 7,192,154 | B2 * | 3/2007 | Becker | 362/133 |
| 7,726,841 | B2 * | 6/2010 | Chien | 362/249.07 |
| 7,832,897 | B2 * | 11/2010 | Ku | 362/249.02 |
| 2010/0148984 | A1 * | 6/2010 | Chien et al. | 340/825.22 |

* cited by examiner

*Primary Examiner* — Jennifer Mehmood
*Assistant Examiner* — Kaleria Knox
(74) *Attorney, Agent, or Firm* — Rosenberg, Klein & Lee

(57) ABSTRACT

An LED (Light Emitting Diode) module includes a base seat and a plurality of LEDs. The base seat includes a planar portion having a planar external surface and a straight portion connected interactively to the planar portion, and having a straight external surface. The plurality of LEDs includes a first LED mounted on the planar external surface of the planar portion to emit light rays in the facing in a vertical direction and a second LED mounted on the straight external surface of the straight portion to emit light rays in the horizontal direction.

18 Claims, 17 Drawing Sheets

| Memory Module | | | | | |
|---|---|---|---|---|---|
| Numbers of press | 01 | 02 | 03 | 04 | |
| 1 | on | on | on | on | Fully lighted |
| 2 | on | off | off | off | Emit light ray in the vertical direction |
| 3 | off | on | on | on | Emit light ray in the horizontal direction |
| 4 | off | off | off | off | Non-lighted |

FIG. 8C

LED (LIGHT EMITTING DIODE) MODULE

This application claims the benefits of the Taiwan Patent Application Serial NO. 097148205, filed on Dec. 11, 2008, the subject matter of which is incorporated herein by reference.

BACKGROUND OF THE INVENTION

1. Field of the Invention

The present invention relates to an LED (Light Emitting Diode) module, more particularly to an LED module that can emit light rays in multiple directions.

2. Description of the Prior Art

The conventional light bulbs or tubes are gradually replaced with LEDs (Light Emitting Diode), since the latter consume lesser energy, radiate lower heat and is in the trend of carbon emission reduction policy of present days. Formerly, LEDs are used only in the indicator lamp or an auxiliary lamp but now serve as the main light emitting elements.

FIG. 1 shows a prior art LED assembly 2 in two modes. Generally speaking, the light emitting rays 10 of the LED 2 has a limited angle, i.e., (1) for directional light of the LED 2a, the limited angle θ ranges from zero to 135 degrees. The limited angle θ seldom exceeds 150 degrees. For multiple light directions of the LED 2b, the light rays 10 tend to sidewise directions. In other words, the LED 2a, 2b generate light rays 10 in two modes, i.e., vertical and horizontal directions only. Therefore, the LED 2a, 2b are unable to emit light rays as those of tungsten bulbs, incandescent light or halogen bulbs that emit light rays in 360 degree angle.

Therefore, it is the object of the present invention to provide an LED module that is capable of emitting light rays in multiple directions.

SUMMARY OF THE INVENTION

One aspect of the present invention is to provide an LED module that is capable of emitting light rays in multiple directions, thereby magnifying the light emitting scope of the LED module.

The LED module of the present invention includes a base seat and a plurality of LEDs (Light Emitting Diode).

The base seat includes a planar portion and a straight portion. The planar portion has a planar external surface facing in a vertical direction. The straight portion is connected interactively to the planar portion, and has a straight external surface facing in a horizontal direction.

The plurality of LEDs (Light Emitting Diode) includes a first LED mounted on the planar external surface of the planar portion and a second LED mounted on the straight external of the straight portion.

Therefore, since the LED module of the present includes a bottom seat of a specific structure upon which the plurality of LEDs are mounted in such a manner to emit light rays in multiple directions, thereby magnifying the light emitting scope of the LED module.

BRIEF DESCRIPTION OF THE DRAWINGS

Other features and advantages of this invention will become more apparent in the following detailed description of the preferred embodiments of this invention, with reference to the accompanying drawings, in which:

FIG. 8C shows a memory module employed in the LED module of the present invention;

DETAILED DESCRIPTION OF THE PREFERRED EMBODIMENTS

Figure 1:
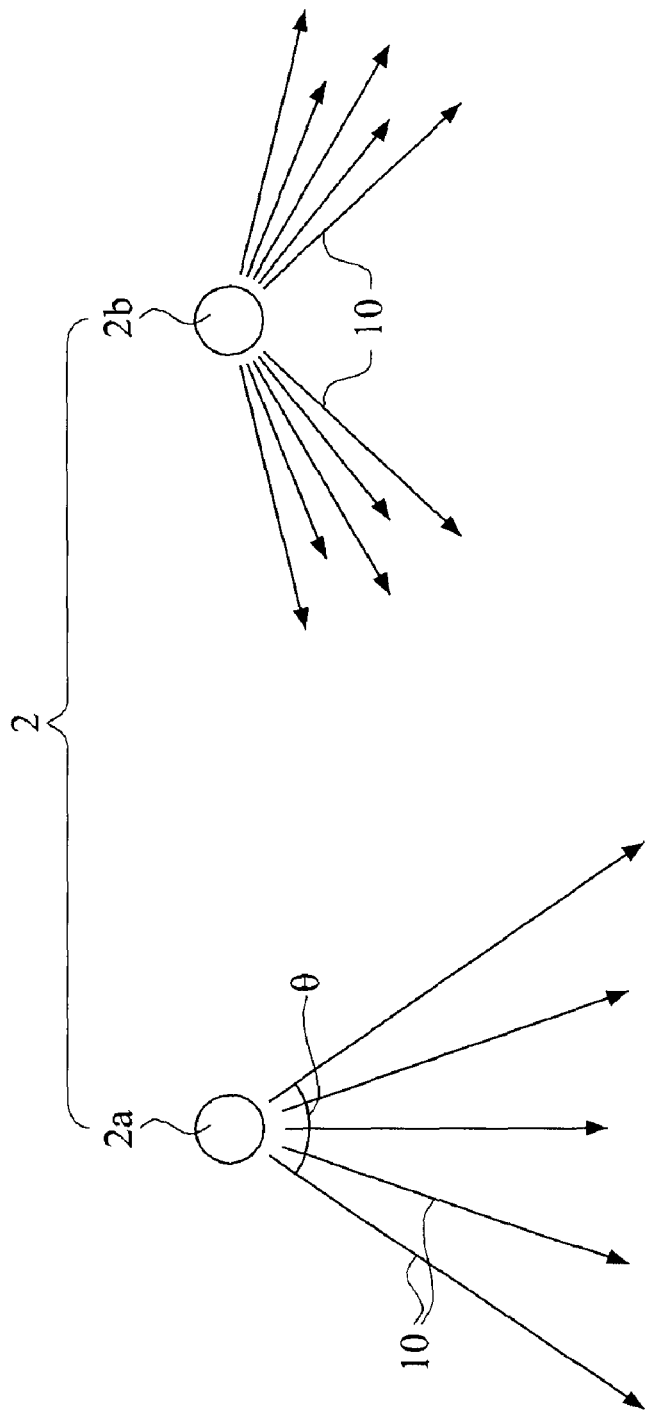
FIG. 1 shows a prior art LED assembly emitting light rays in two modes.
Figure 2:
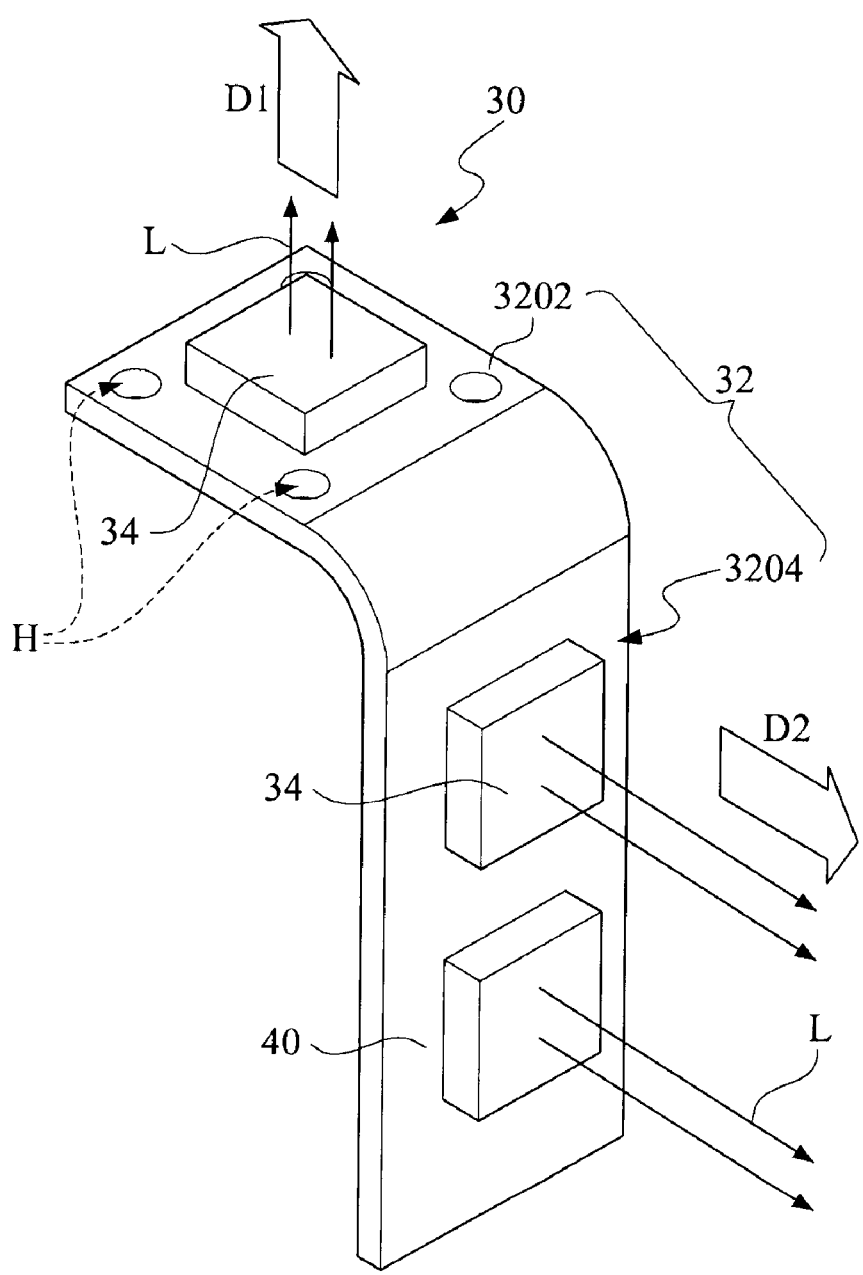
FIG. 2 is a perspective view of the first embodiment of an LED module of the present invention.

FIG. 2 is a perspective view of the first embodiment of the LED module 30 of the present invention. The LED module 30 is capable emitting light rays in multiple directions, and includes a base seat 32 and a plurality of LEDs (Light Emitting Diode) 34.

The base seat 32 includes a planar portion 3202 and a straight portion 3204. The planar portion 3202 has a planar external surface facing in a vertical direction D1. The straight portion 3204 is connected interactively to the planar portion 3202, and has a straight external surface facing in a horizontal direction D2.

In practice, the planar and straight portions 3202, 3204 are preferably made from aluminum sheet due to its light weight, easy heat dissipation ability and light reflection property. The planar and straight portions 3202, 3204 can be integrally formed with each other and are fabricated by punching, caste molding process, welding process and any other means so long as the module thus produced has aesthetic appearance and effective heat dissipation property.

The plurality of LEDs (Light Emitting Diode) 34 includes a first LED mounted on the planar external surface of the planar portion 3202 and a second LED mounted on the straight external of the straight portion 3204. In addition, the planar external surface and the straight external surface of the planar and straight portions 3202, 3204 are respectively formed with two recesses (not shown in the drawing) for receiving the first and second LEDs 34 such that the latter can emit light rays L in the vertical and horizontal direction D1, D2.

Referring again to FIG. 2, the planar portion 3202 extends along the horizontal direction D2 so that the planar external surface faces toward the vertical direction D1. The straight portion 3204 in fact is a plate 40 that is bent relative to and extends downwardly from one end of the planar portion 3202 so that the LED module is L-shaped. In other words, the planar external surface of the planar portion 3202 is exposed to an upper side such that the first LED 34 is exposed to the upper side while the second LED 34 mounted on the straight external surface of the straight portion 3204 is exposed to a sidewise direction of the planar portion 3202.

In the drawing, there are three LEDs 34, one LED 34 is mounted on the planar external surface of the planar portion 3202 while two LEDs 34 are mounted on the straight external surface of the straight portion 40 such that the assembly of LEDs 34 emit light rays L in two dimensional direction.

Figure 3:
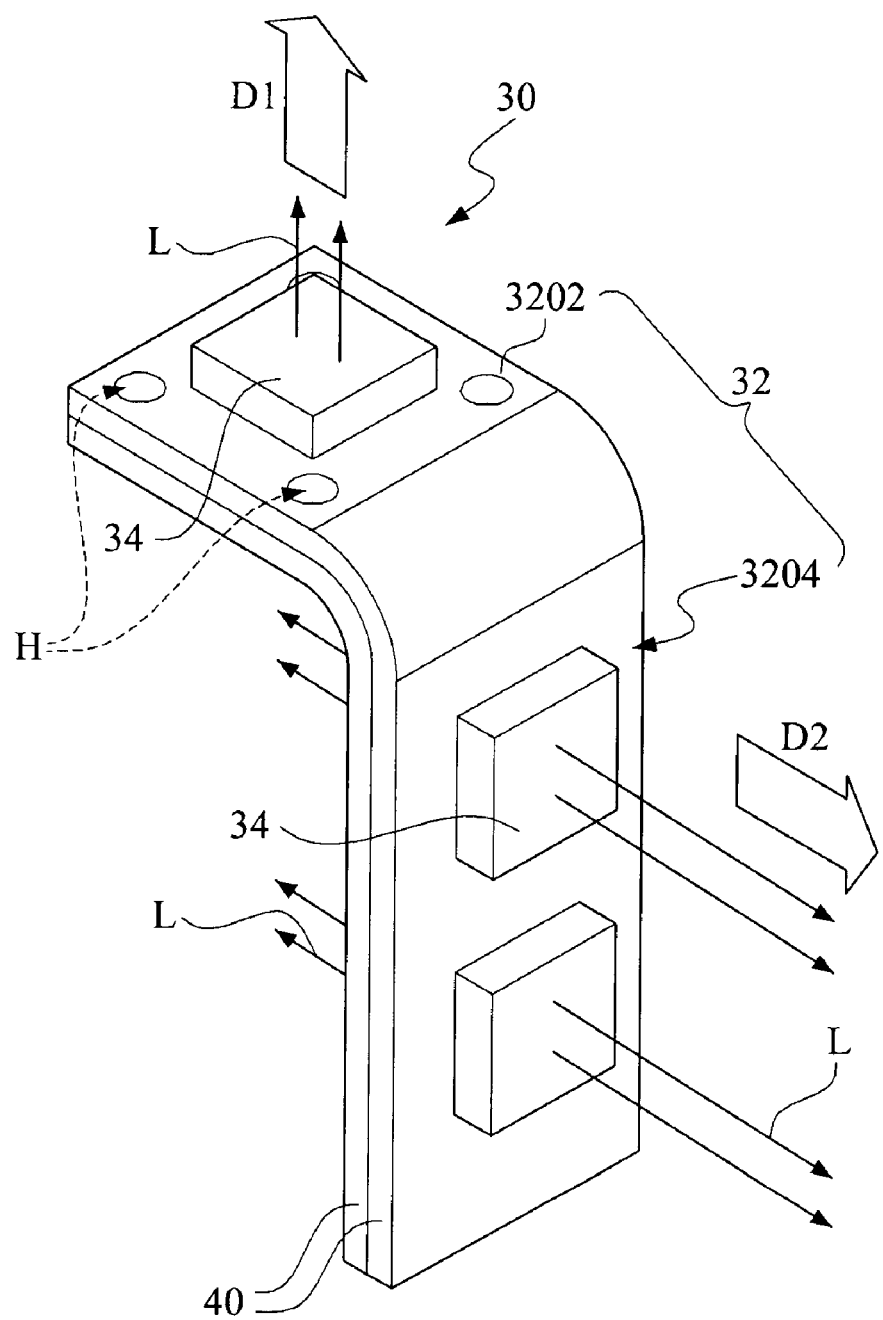
FIG. 3 is a perspective view of one modification of the first embodiment of the LED module of the present invention.

FIG. 3 is a perspective view of one modification of the first embodiment of the LED module 30 of the present invention. Note that the bottom seat 32 is L-shaped from a lateral view and the straight portion 3204 includes first and second laminated layers cooperatively define a gap to permit extension of wiring cables for coupling the LEDs 34. The plurality of LEDs 34 further includes a third LED (in fact two pieces) mounted on the second laminated layer 40 opposite to the first LED 34 such that the LED module 30 emit light rays L in three dimensional directions, thereby magnifying the light emitting scope of the LED module 30.

Figure 4:
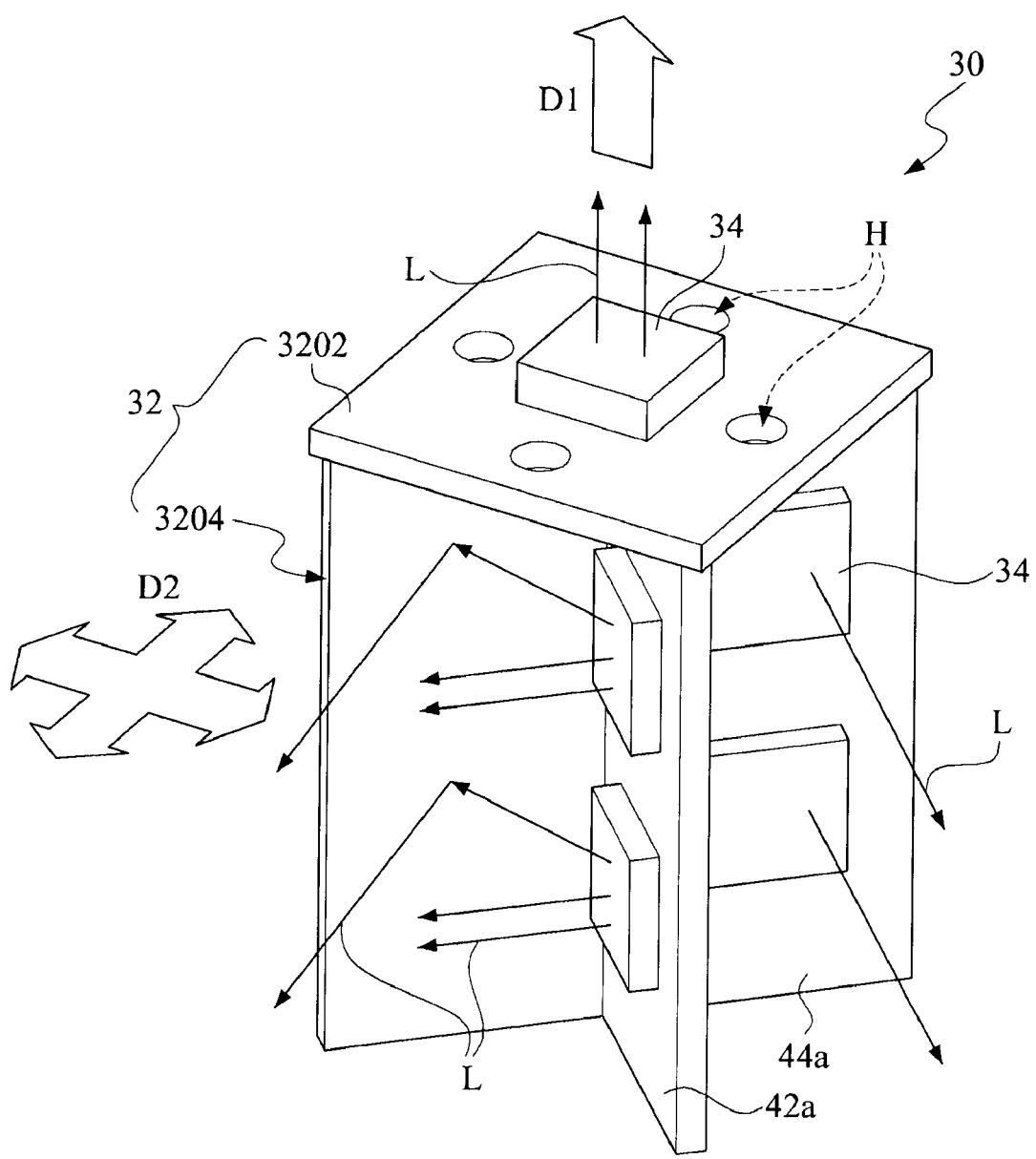
FIG. 4 is a perspective view of the second embodiment of the ED module of the present invention.

FIG. 4 is a perspective view of the second embodiment of the ED module 30 of the present invention. As illustrated, the planar portion 3202 is located above the straight portion 3204 to extend in the horizontal direction D2 and its planar external surface faces in the vertical direction D1. The straight portion 3204 includes a first straight layer 42a and a second straight layer 44a connected perpendicularly to the first straight layer 42a at the intermediate portions thereof such that the straight portion is a cross in cross-section and has eight straight external surfaces facing in the horizontal direction D2.

In the drawings, there are nine LEDs on the LED module 30 of the present invention. To be more specific, one is mounted on the planar external surface of the planar portion 3202. After assembly, the straight portion 3204 has eight layer sections (44a, 42a), each layer section has opposite sides. Two LEDs 34 are mounted to one side of the first layer section 44a while two LEDs 34 are mounted on one side of the second layer section 42a such that the second layer section 42a has a blank side facing the LEDs 34 on the first layer section 44a. In order to economize the number of LED and since aluminum sheets are capable of reflecting light rays therefrom, once the LEDs are mounted on the eight layer sections 44a, 42a, the LEDs 34 emit light rays L in nine directions, four of which are being reflected light rays, as best shown in FIG. 4.

Figure 5:
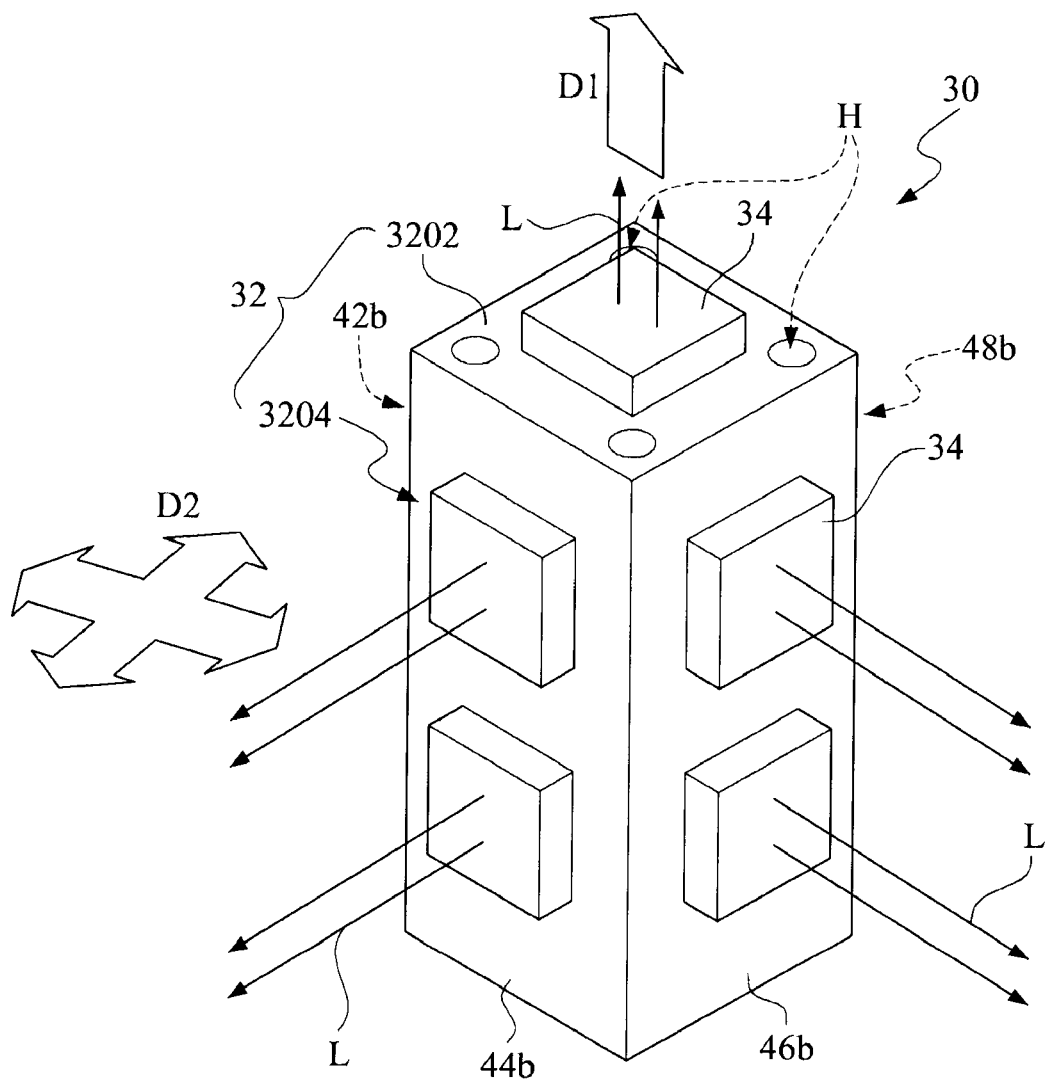
FIG. 5 is a perspective view of the third embodiment of the LED module of the present invention.

FIG. 5 is a perspective view of the third embodiment of the LED module of the present invention. As illustrated, the planar portion 3202 is located above the straight portion 3204 to extend in the horizontal direction D2 and its planar external surface faces in the vertical direction D1. The straight portion 3204 includes first, second, third and fourth identical straight layers 42b,44b,46b,48b connected perpendicularly to one another in such a manner that said first, second, third and fourth identical straight layers 42b,44b,46b,48b cooperatively form a square block in cross section. Under this condition, the straight portion 3204 has four straight external surfaces facing in the horizontal direction D2.

In the drawings, there are nine LEDs on the LED module 30 of the present invention. To be more specific, one is mounted on the planar external surface of the planer portion 3202. Two LEDs 34 are mounted on each straight external surface of the respective straight layer 42b, 44b, 46b, 48b. Once the LEDs 34 are mounted on the LED module 30 of the present invention, the LEDs 34 emit light rays L in five directions.

Figure 6:
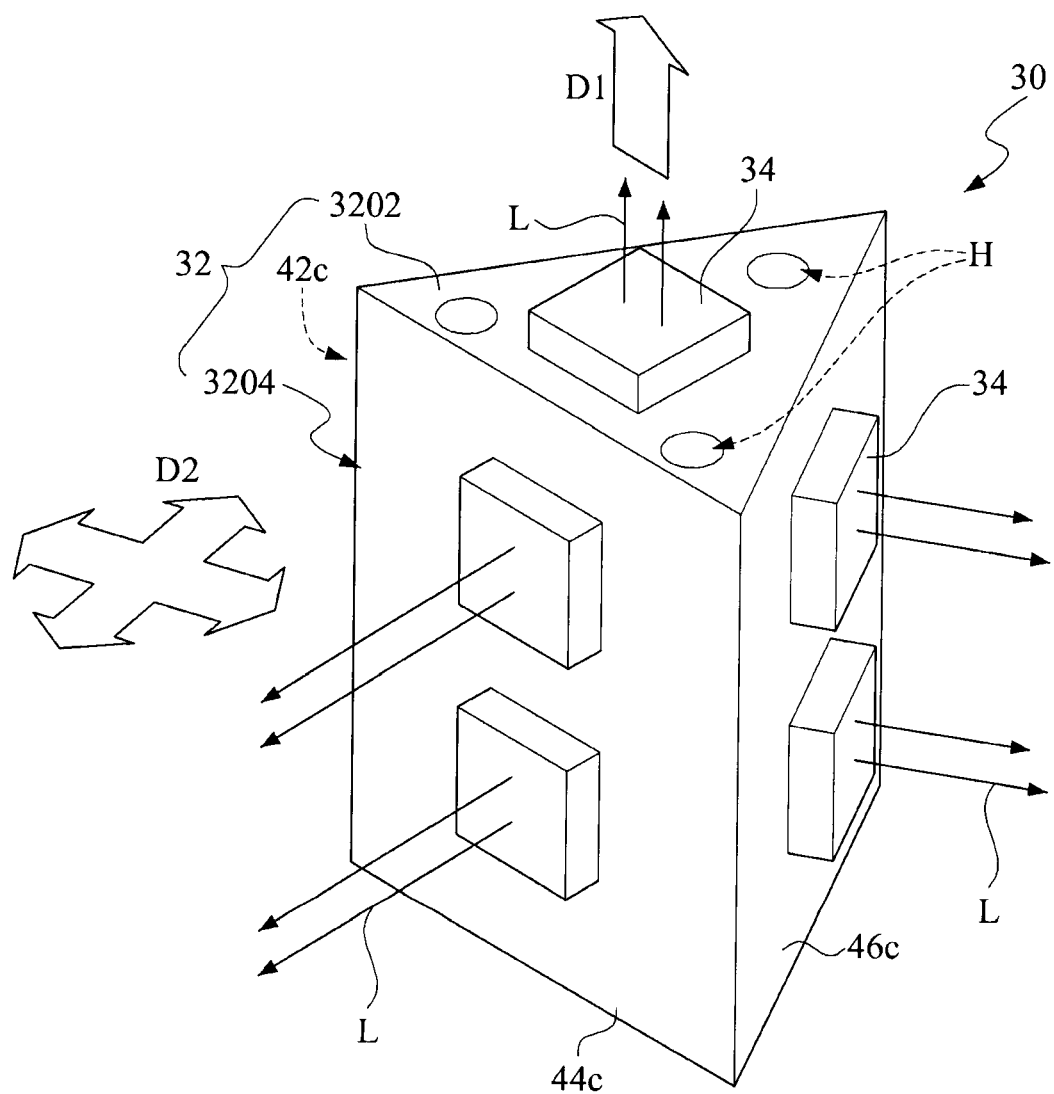
FIG. 6 is a perspective view of the fourth embodiment of the LED module of the present invention.

FIG. 6 is a perspective view of the fourth embodiment of the LED module of the present invention. As illustrated, the planar portion 3202 is located above the straight portion 3204 to extend in the horizontal direction D2 and its planar external surface faces in the vertical direction D1. The straight portion 3204 includes first, second and third identical straight layers 42c, 44c, 46c extending downward from the planar portion 3202 and are connected to one another in such a manner that the first, second and third identical straight layers 42c, 44c, 46c cooperatively form a triangle in cross section.

In the drawing, there are seven pieces of LEDs 34 on the LED module 30 of the present invention. To be more specific, one is mounted on the planar external surface of the planer portion 3202. Two LEDs 34 are mounted on each straight external surface of the respective identical straight layers 42c, 44c, 46c. Once the LEDs 34 are mounted on the LED module 30 of the present invention, the LEDs 34 emit light rays L in four directions. Moreover, an adjacent two of the first, second and third identical straight layers 42c, 44c, 46c cooperatively define 120 degree angle therebetween. Note that lesser LEDs 34 are implemented in the LED module 30 of the present invention, thereby economizing the manufacturing expense thereof.

For extension of the wiring cables, the bottom seat 32 can be formed several cable bores or the wiring cables for interconnecting the LEDs 34 can be confined in the clearance defined by first and second laminated layers of the straight portion. Note that the cable bores not only permit extension of the wiring cables, but enhance the heat dissipation property of the LED module 30.

As illustrated in the first, second, third and fourth embodiments of the present invention, there are several cable bores H formed through the planar portion 3202 to facilitate heat dissipation therefrom.

Figure 7:
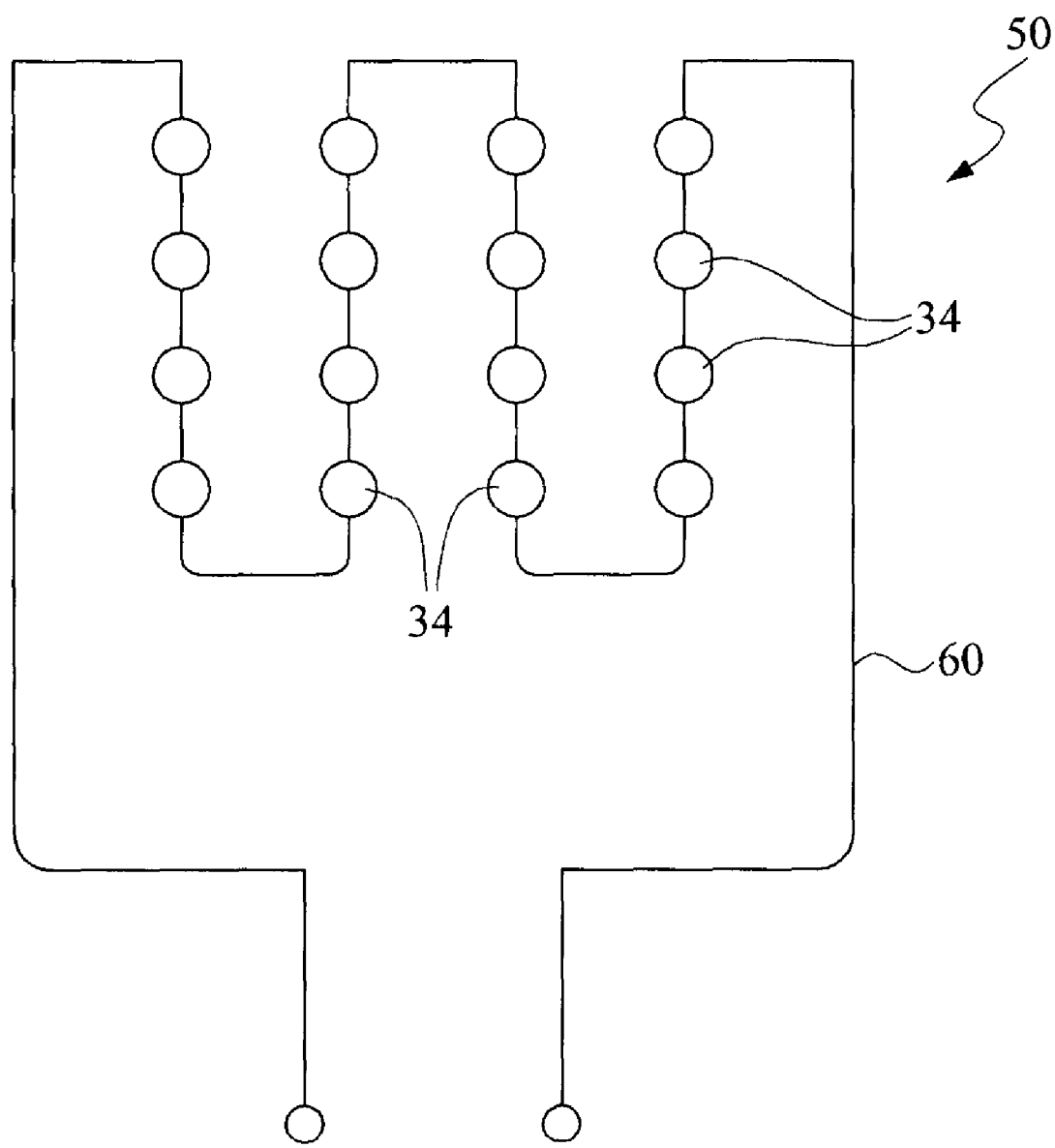
FIG. 7 illustrates how wiring cable set interconnect a plurality of LEDs to a power source in the LED module of the present invention.

FIG. 7 illustrates how a wiring cable set 60 interconnect a plurality of LEDs 34 to a power source in the LED module 30 of the present invention. The LEDs 34 are connected to one another in series 50 such that all the LEDs 34 are simultaneously switched off or switched on so no specific direction can be controlled.

Figure 8A:
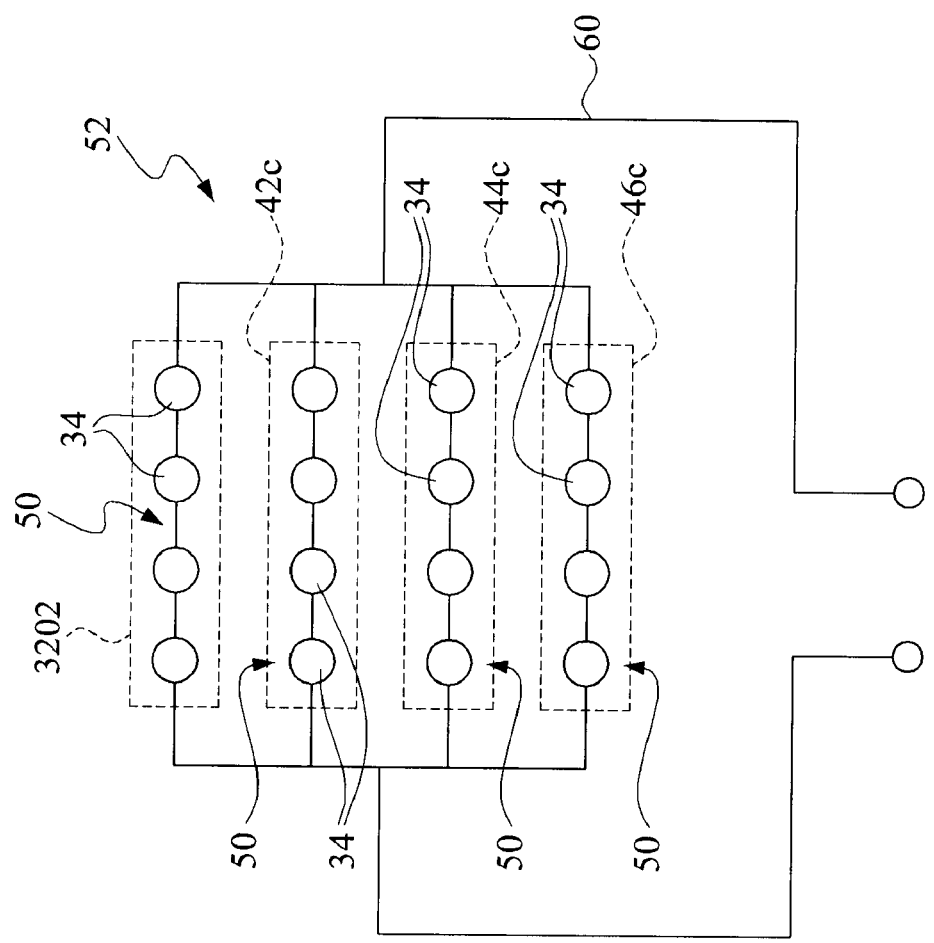
FIG. 8A illustrates how another wiring cable set interconnect a plurality of LEDs to a power source in the LED module of the present invention.

FIG. 8A illustrates how another wiring cable set interconnect a plurality of LEDs 34 to a power source in the LED module 30 of the present invention. If a specific direction is required to be controlled, the LEDs 34 on the planar portion 3202 and the LEDs 34 on the straight portion 3204 are connected to one another in parallel manner 52.

As to how the LEDs 34 are connected to one another will be explained utilizing FIG. 6. The LEDs 34 on the planar portion 3202 are connected to each other in series so as to form a first series set while the LEDs 34 on the straight layers 42c, 44c, 46c of the straight portion 3204 are connected to one another in series so as to form three second series sets, which are connected respectively to the first series set in parallel manner.

Figure 8B:
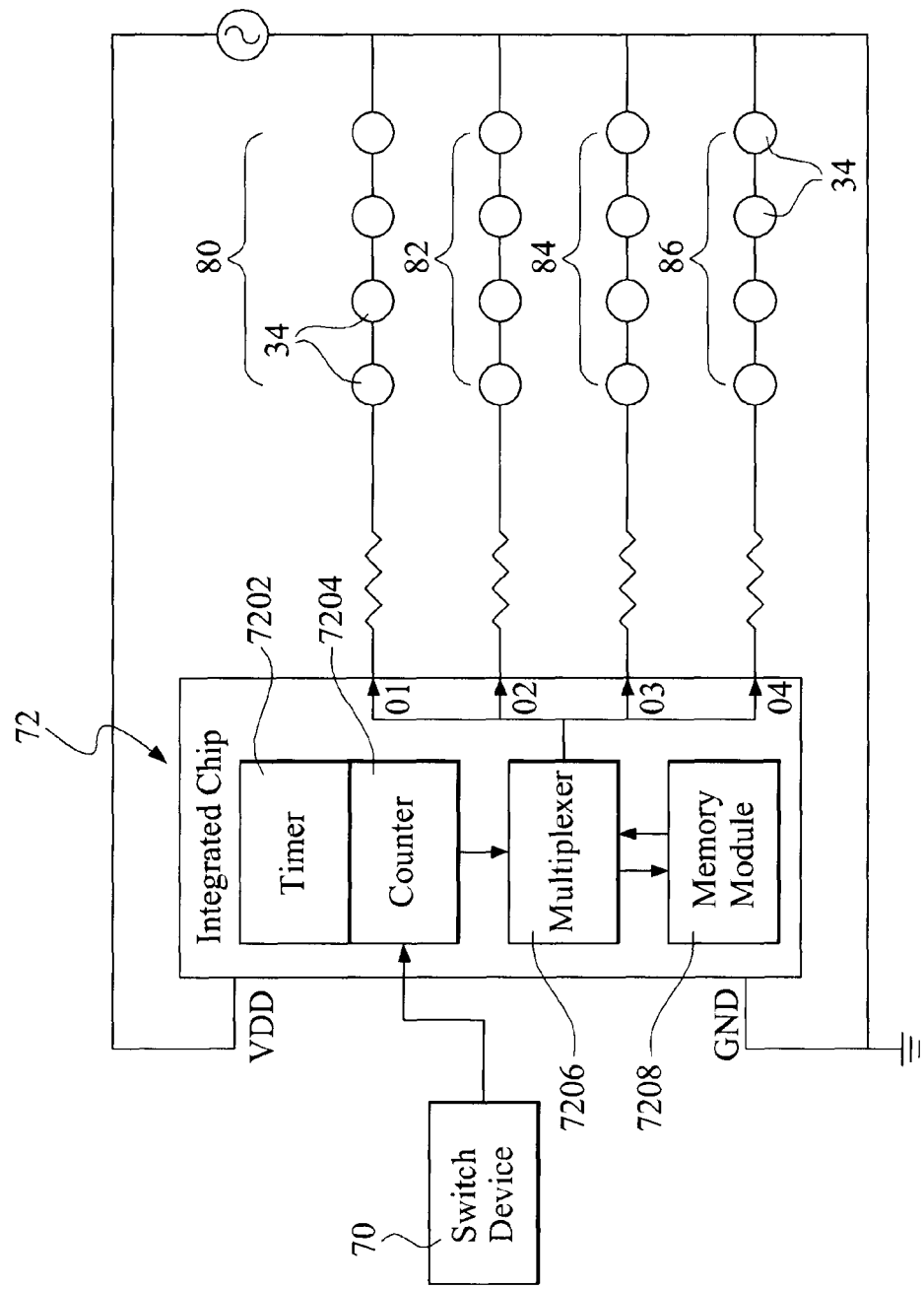
FIG. 8B illustrates how a switch device is employed for interconnecting the wiring cable set, the plurality of LEDs to a power source in the LED module of the present invention.

FIG. 8B illustrates how a switch device 70 is employed for interconnecting the wiring cable set, the plurality of LEDs 34 to a power source in the LED module 30 of the present invention. In the above embodiment, by operating the switch device 70, all the LEDs 34 can be switched on so as to emit light rays in the vertical and horizontal directions D1, D2 or the LEDs 34 for emitting the light rays in the vertical direction D1 is switched on while the LEDs 34 for emitting the light rays in the horizontal direction D2 is switched off and vice versa. When thus arranged, one can control a specific light emitting direction; a relatively large amount of power source can be minimized and is in the trend to reduce the carbon emission measure.

In FIG. 8B, there are four sets of series connections 80, 82, 84, 86. The LEDs 34 of the first series connection emit light rays in the vertical direction D1 while the LEDs 34 of the second, third and fourth series connections emit light rays in the horizontal direction D2.

Note that the switch device 70 is further electrically connected to an integrated chip 72 which consists of a timer 7202, a counter 7204, a multiplexer 7206 and a memory module 7208.

Referring to FIGS. 8B and 8C, wherein FIG. 8C shows a memory module 7208 employed in the LED module 30 of the present invention. The memory module 7208 is stored with a data list 90 concerning about arrangement of the switch device 70. When the switch device 70 is depressed, the counter 7204 cooperates with the timer 7204 to determine the numbers of depressions. After confirming the number of depressions, the multiplexer 7206 will compare the same relative to a table in the memory module. For instance, if the switch device 70 is pressed twice, the multiplexer 7206 will locate the output port 01, 02, 03, 04 representing respectively On, Off, Off and Off. Thus, the multiplexer 7206 is capable of controlling the output ports 01, 02, 03, 04 and operates in the On, Off, Off and Off mode, in which the LEDs of the series connection 80 are switched on while the LEDs the series connections 82, 84, 86 are switched off. In other words, the LED module 30 of the present invention emits light rays in the vertical direction.

Since a specific direction of the light rays can be optionally controlled, discarding of the LED module 30 of the present invention can be avoided due to one or partial damage in one of the series connections.

Figure 9A:
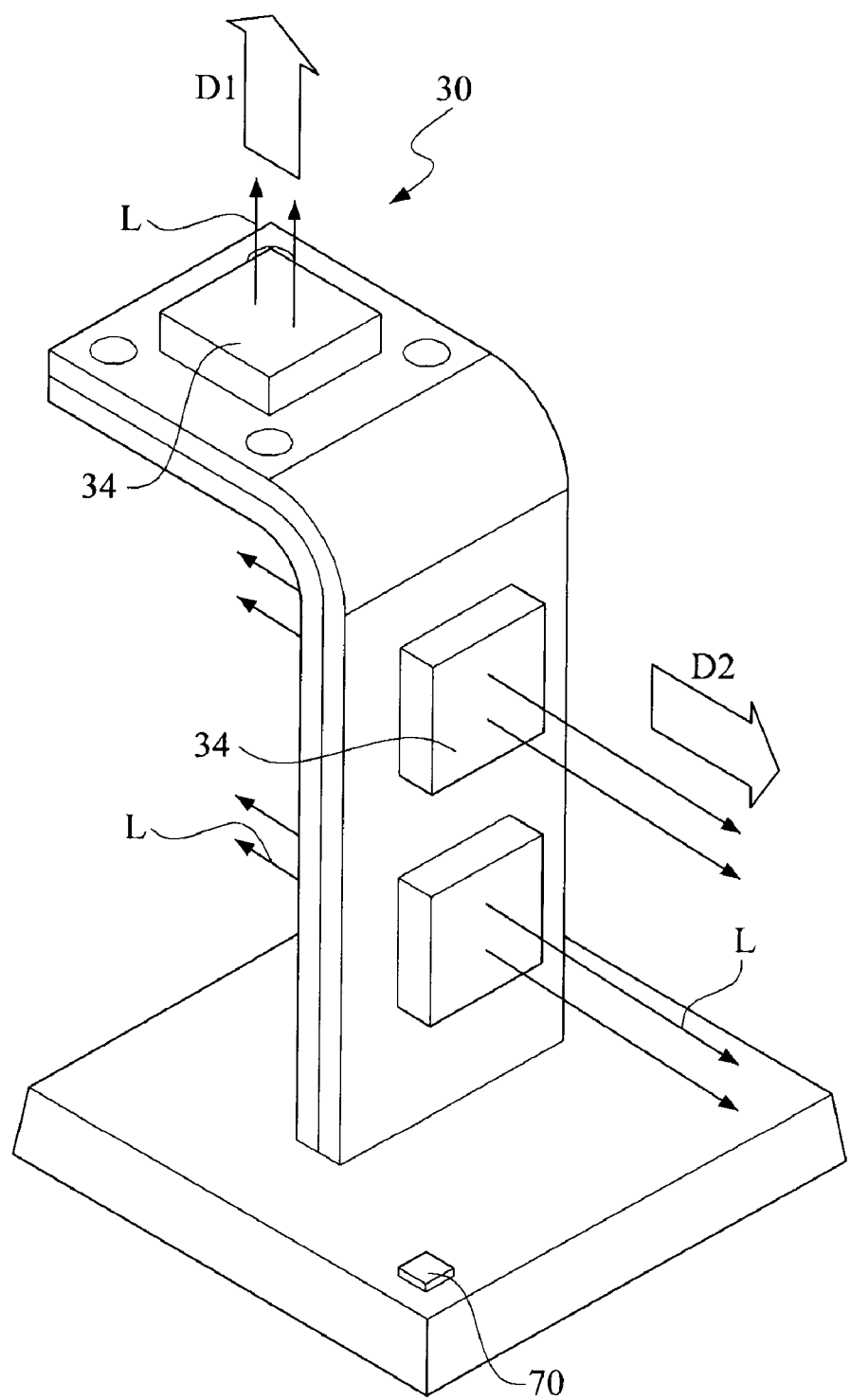
FIG. 9A shows a first type of mounting the switch device on the LED module of the present invention.

FIG. 9A shows a first type of mounting the switch device 70 on the LED module 30 of the present invention, wherein the witch device 70 is installed on an external surface of the LED module 30.

Figure 9B:
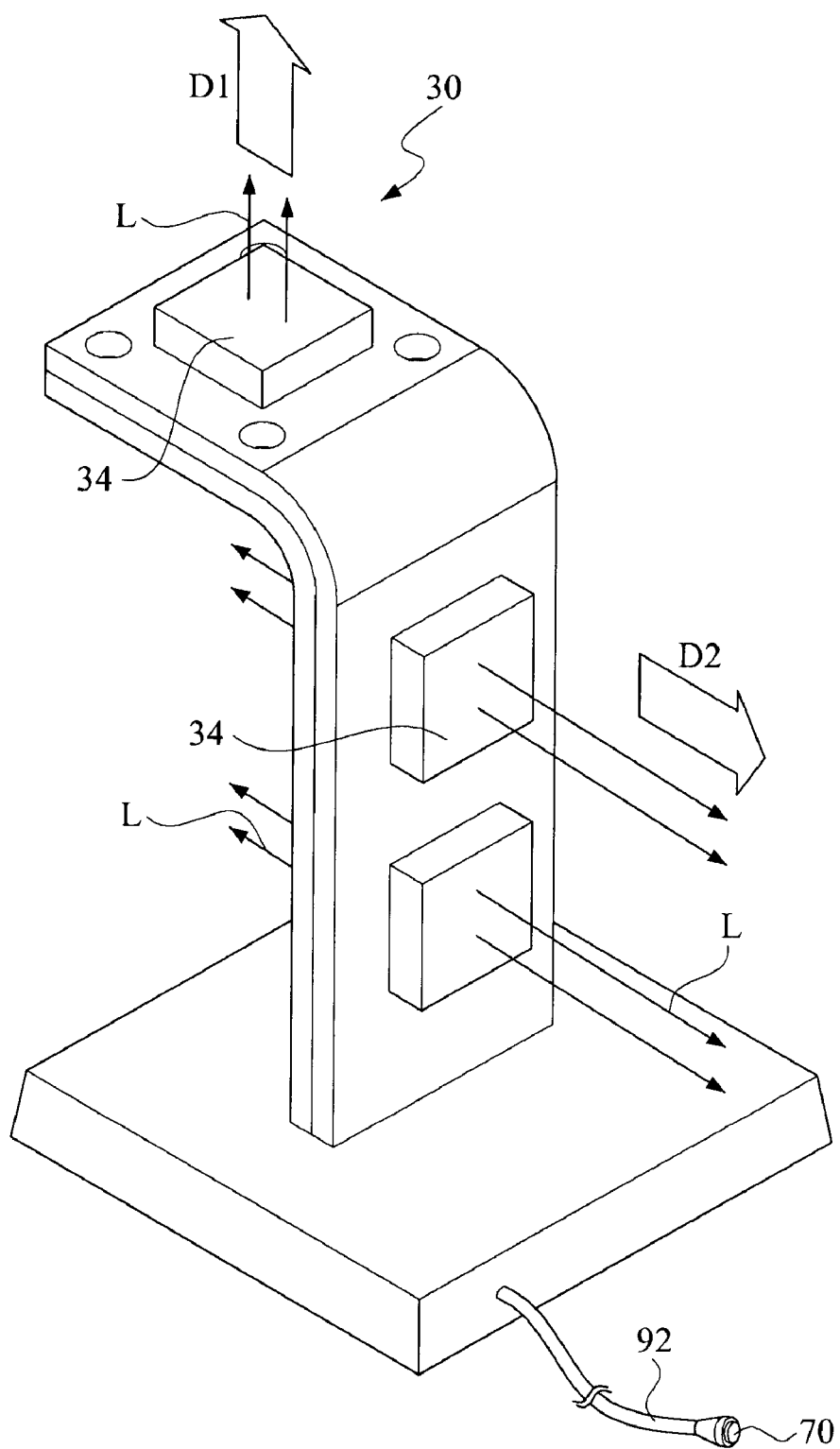
FIG. 9B shows a second type of mounting the switch device on the LED module of the present invention.

FIG. 9B shows a second type of mounting the switch device 70 on the LED module 30 of the present invention. The LED module 30 further includes a signal cable 92 extending outward from the module body. The switch device 70 can be installed on the signal cable 92 so that the user can operate the LEDs 34 even though he is somewhat spaced apart from the LED module 30.

Figure 9C:
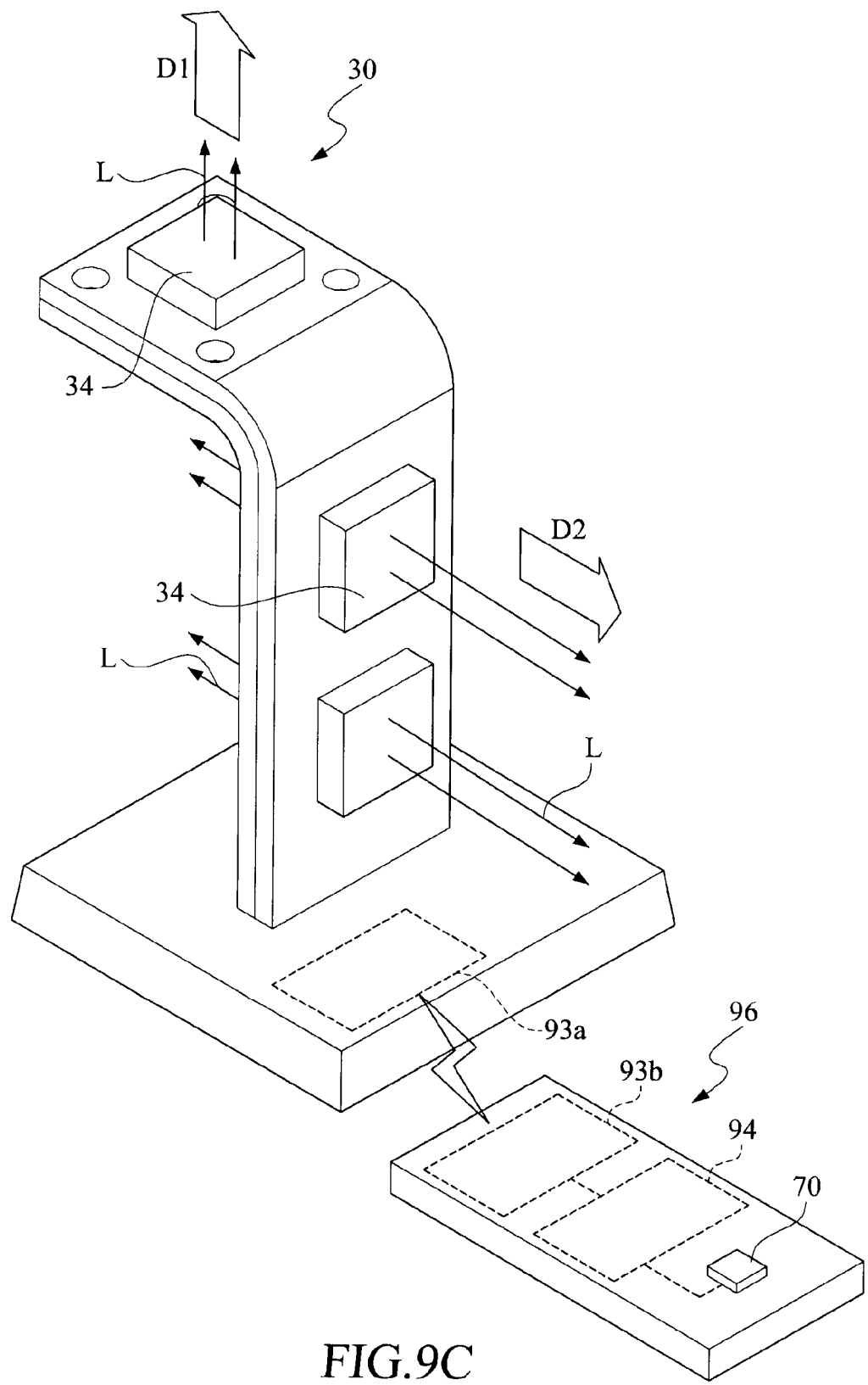
FIG. 9C shows a third type of mounting the switch device on the LED module of the present invention.

FIG. 9C shows a third type of mounting the switch device 70 on the LED module 30 of the present invention. The LED module 30 further includes a first short-distance wireless communication module 93a. The switch device 70 is mounted on a remote control 96, which includes a second short-distance wireless communication module 93b and a processor 94, which is in electrical communication with the integrated chip 72 (see FIG. 8A).

Under this condition, activation of the switch device causes the processor 94 to generate a switch on/off command for transmitting to the first short-distance wireless communication module 93a on the LED module 30 via the second short-distance wireless communication module 93b, thereby remotely controlling switching on/off the LEDs.

Figure 10:
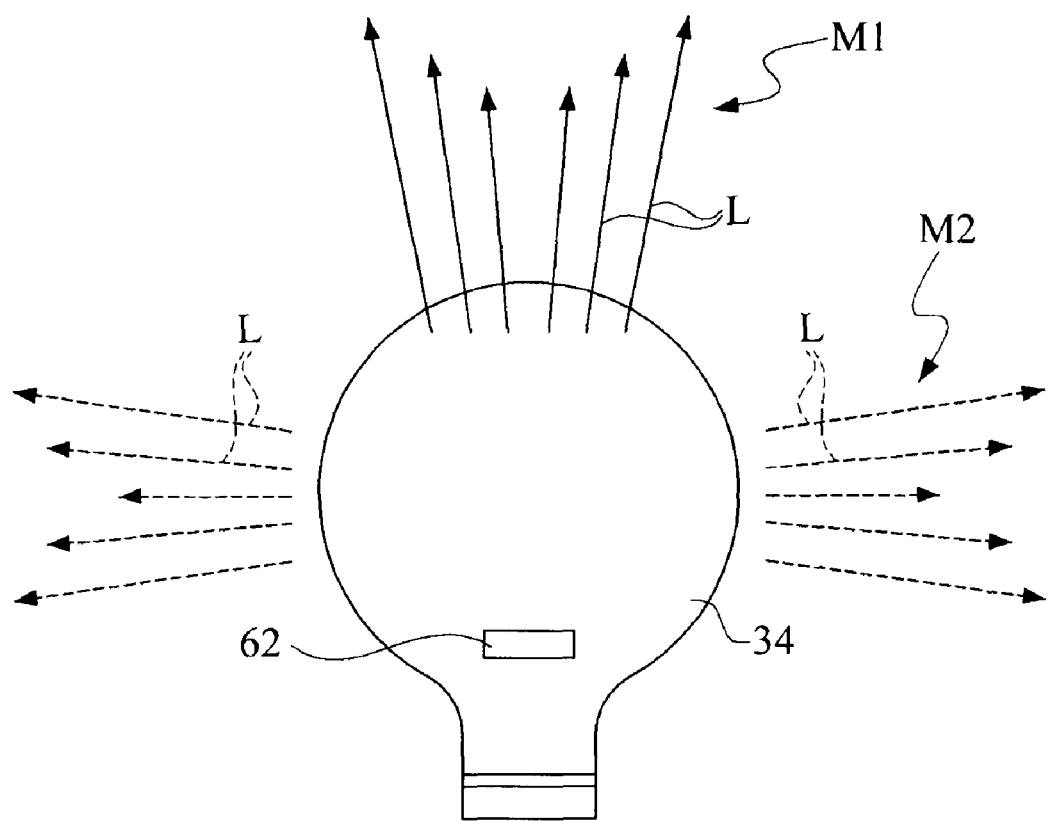
FIG. 10 shows the switch device on the LED module of the present invention capable of switching the LED module on in two different modes.

FIG. 10 shows the switch device 62 on the LED module 30 of the present invention capable of switching the LEDs 34 in two different modes simultaneously, i.e., the LEDs emit light rays L in the vertical direction M1 and the horizontal direction M2. The switch device 62 can be arranged to operate in either one or the other modes.

Several sets of LEDs 34 can be employed in the LED module 30 of the present invention. The switch device 62 can be coupled to the sets of LEDs 34 to generate light rays in multiple directions. By combining the parallel connections mentioned above, different light emitting modes can be arranged so as to adjust the dimness of the light rays.

Figure 11:
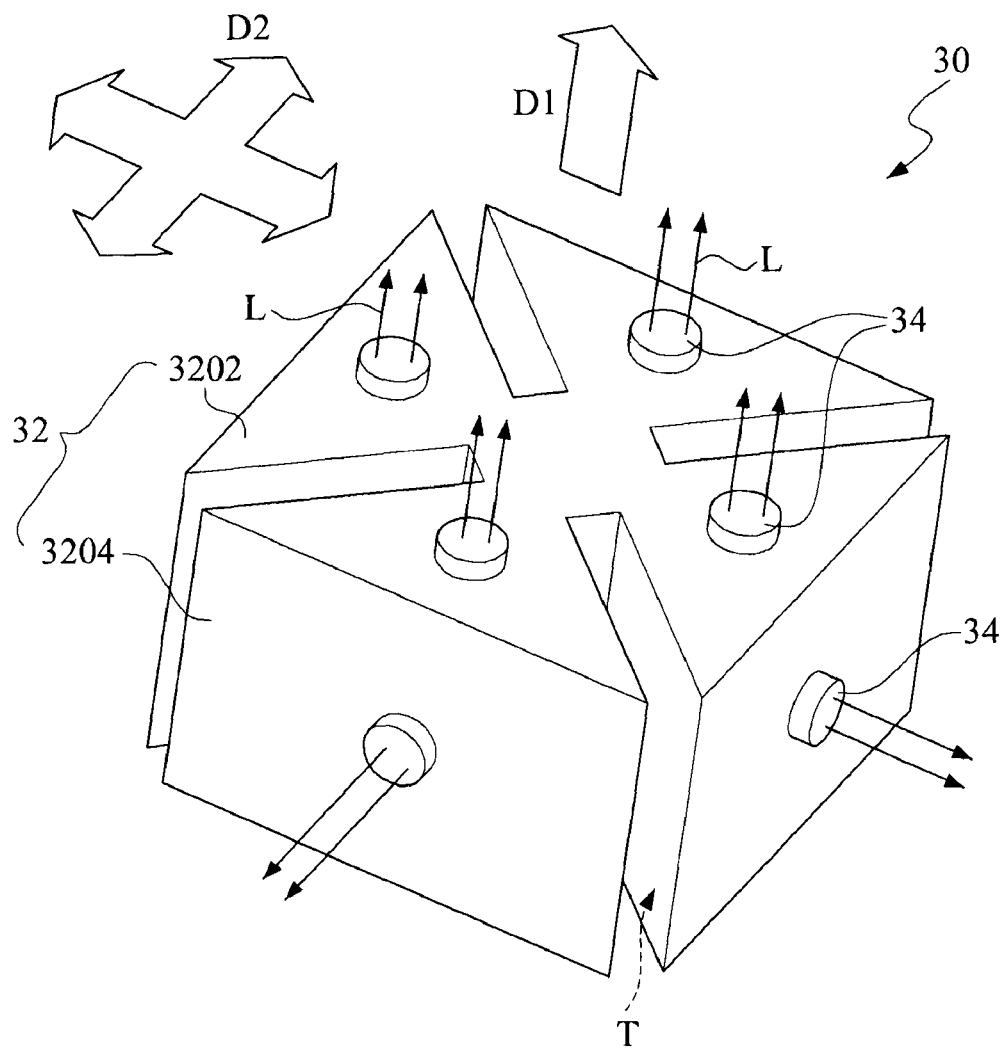
FIG. 11 is a perspective view of the fifth embodiment of the LED module of the present invention.

FIG. 11 is a perspective view of the fifth embodiment of the LED module 30 of the present invention. As illustrated, the planar portion 3202 is located above the straight portion 3204 to extend in the horizontal direction D2, and has the planar external surface facing in the vertical direction D1. The straight portion 3204 includes first, second, third and fourth identical triangular blocks connected to one another along a vertical axis X in such a manner that an adjacent pair of the triangular blocks cooperatively define an axial slot T therebetween, which enhances heat dissipation property of the LED module 30 of the present invention.

Figure 12:
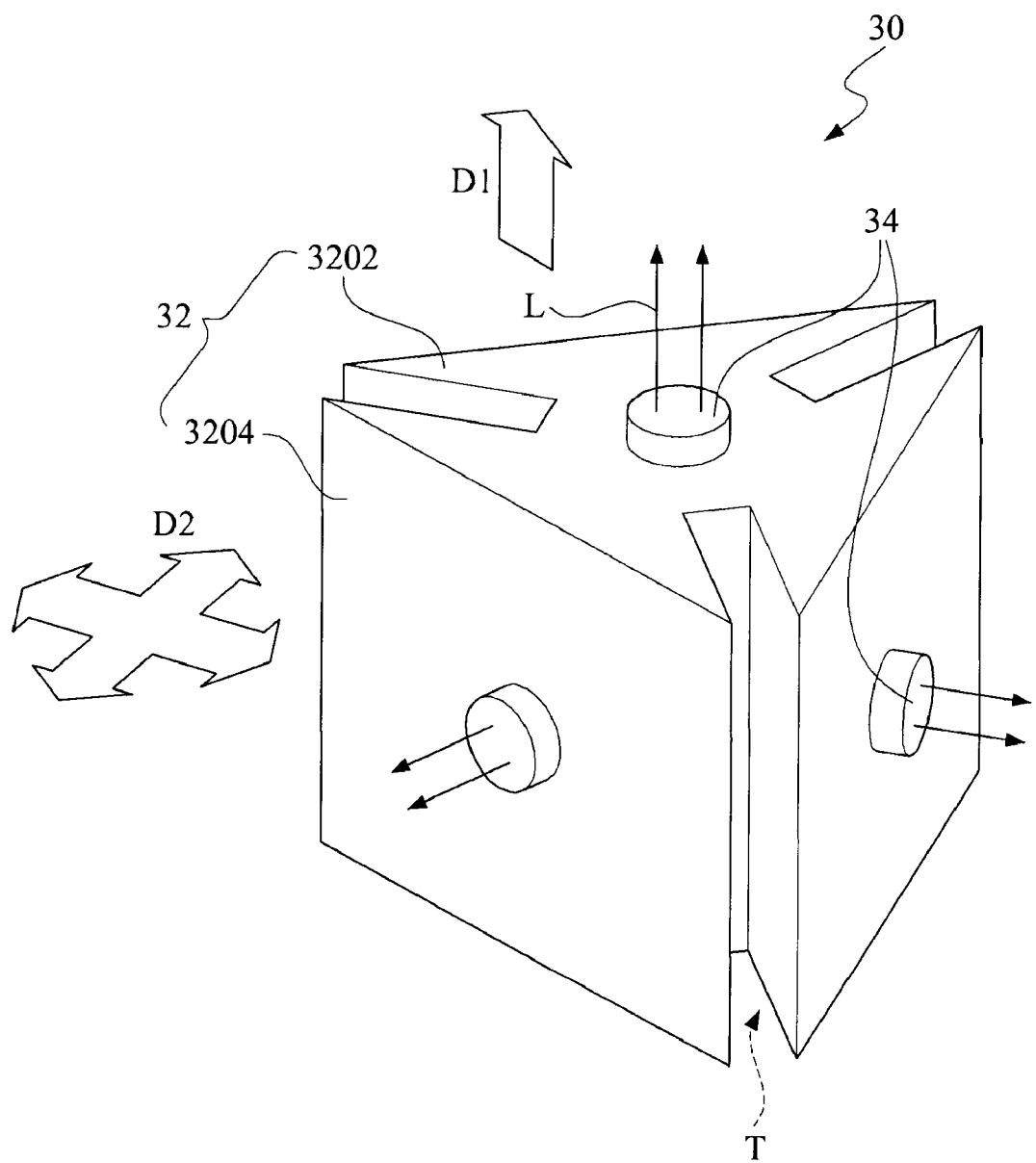
FIG. 12 is a perspective view of the sixth embodiment of the LED module of the present invention.

FIG. 12 is a perspective view of the sixth embodiment of the LED module of the present invention. As illustrated, the planar portion 3202 is located above the straight portion 3204 to extend in the horizontal direction D2, and has the planar external surface facing in the vertical direction D1. The straight portion 3204 includes first, second and third identical triangular blocks connected to one another along a vertical axis X in such a manner that an adjacent pair of the triangular blocks cooperatively define an axial slot T therebetween, which enhances heat dissipation property of the LED module 30 of the present invention.

Figure 13:
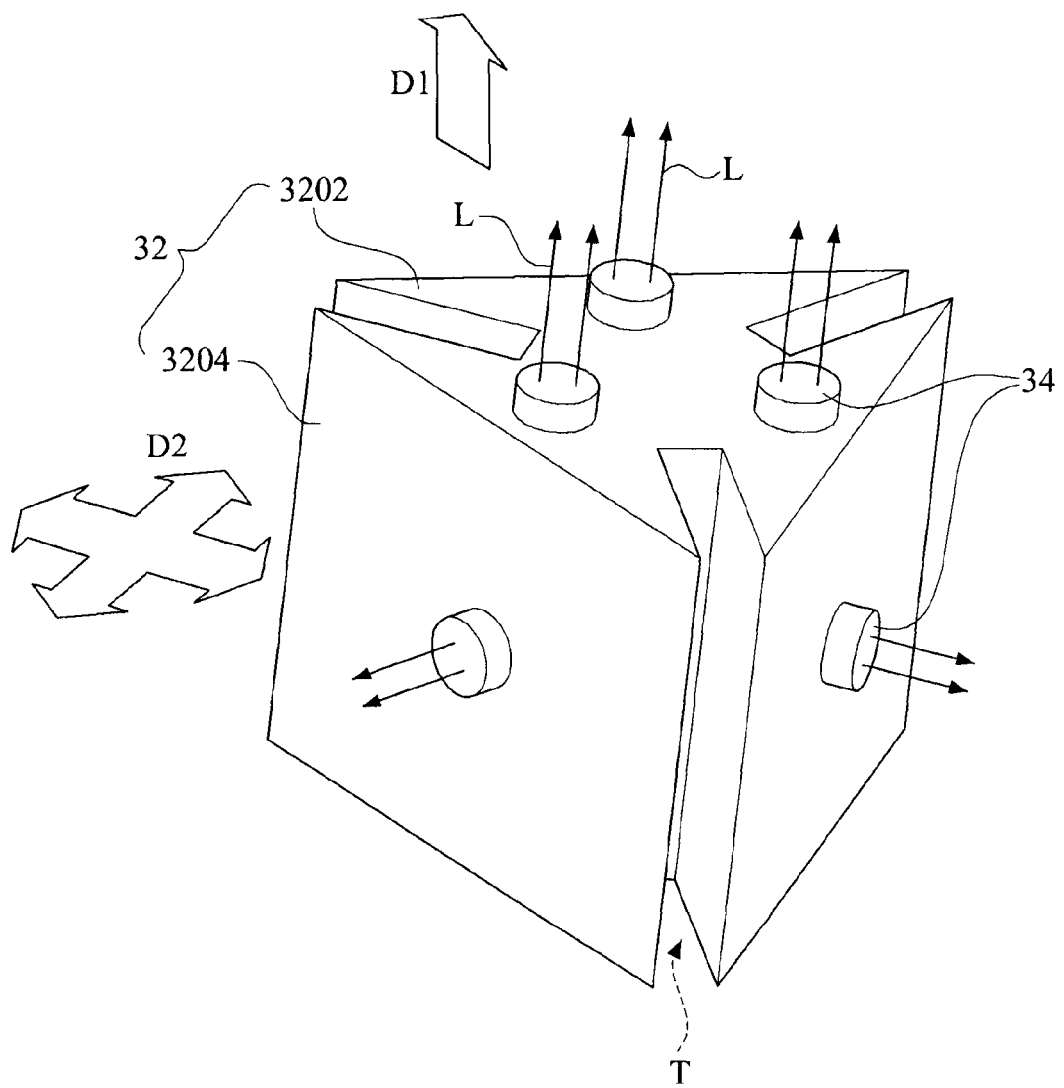
FIG. 13 is a perspective view of the seventh embodiment of the LED module of the present invention.

FIG. 13 is a perspective view of the seventh embodiment of the LED module of the present invention, and has the structure the same as the sixth embodiment, except in that three LEDs 34 are mounted on the planar external surface of the planar portion 3202 so as to emit stronger light rays L in the vertical direction while each LED 34 is mounted on the straight external surface of a respective one of the triangular blocks so as to emit light rays in the horizontal direction D2.

As described above, the LED module 30 of the present invention is capable of emitting light rays L in the multiple directions due to the L-shaped bottom seat 32, thereby magnifying the light emitting scope of the LED module.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. An LED (Light Emitting Diode) module comprising:
   a base seat including
      a planar portion having a planar external surface facing in a vertical direction, and
      a straight portion connected interactively to said planar portion, and having a straight external surface facing in a horizontal direction; and
   a plurality of LEDs (Light Emitting Diode) including a first LED mounted on said planar external surface of said planar portion and a second LED mounted on said straight external surface of said straight portion;
   said planar portion is located above said straight portion to extend in the horizontal direction, said straight portion including first, second and third identical triangular blocks connected to one another along a vertical axis in such a manner that an adjacent pair of said triangular blocks cooperatively defines an axial slot therebetween.

2. The LED (Light Emitting Diode) module according to claim 1, said planar external surface and said straight external surface of said planar and straight portions are respectively formed with two recesses for receiving said first and second LEDs.

3. The LED (Light Emitting Diode) module according to claim 1, wherein said planar and straight portions are made from aluminum sheet.

4. The LED (Light Emitting Diode) module according to claim 1, wherein said planar and straight portions are integrally formed with each other.

5. The LED (Light Emitting Diode) module according to claim 1, wherein said planar and straight portions are formed by a plurality of laminated layers.

6. The LED (Light Emitting Diode) module according to claim 1, wherein said planar portion extends along a horizontal direction while said straight portion extends downwardly from one end of said planar portion.

7. The LED (Light Emitting Diode) module according to claim 6, wherein said planar external surface of said planar portion is exposed to an upper side such that said first LED is exposed to said upper side while said second LED mounted on said straight external surface of said straight portion is exposed to a sidewise direction of said planar portion.

8. The LED module according to claim 1, wherein said planar portion is located above said straight portion to extend in the horizontal direction, said straight portion further including a fourth identical triangular block with said first, second, third and fourth identical triangular blocks connected to one another along a vertical axis in such a manner that an adjacent pair of said triangular blocks cooperatively define an axial slot therebetween.

9. The LED (Light Emitting Diode) module according to claim 8, wherein said straight portion includes first and second laminated layers, said plurality of LEDs further including a third LED mounted on said second laminated layer opposite to said second LED.

10. The LED module according to claim 1, wherein said planar portion is located above said straight portion to extend in the horizontal direction, said straight portion including first, second and third identical straight layers oriented to one another in such a manner that said first, second and third identical straight layers cooperatively form a triangle in cross section.

11. The LED module according to claim 1, wherein said planar portion is located above said straight portion to extend in the horizontal direction, said straight portion including first, second and third identical straight layers extending downward from said planar portion and oriented to one another in such a manner that said first, second and third identical straight layers cooperatively form a triangle in cross section, each of said identical straight layers having said straight external surface formed with said second LED.

12. The LED module according to claim 1, further comprising wiring cables 60 for connecting said plurality of LEDs to a power source.

13. The LED module according to claim 1, wherein said plurality of LEDs (Light Emitting Diode) includes a first set LEDs mounted on said planar external surface of said planar portion and connected to one another in series and a second set of LEDs mounted on said straight external surface of said straight portion and connected to one another in parallel.

14. The LED module according to claim 1, further comprising a switch device capable of switching off/on said first LED on said planar external surface of said planar portion and said second LED on said straight external surface of said straight portion in the vertical and horizontal directions.

15. The LED module according to claim 1, further comprising a switch device capable of switching off/on said first LED on said planar external surface of said planar portion and said second LED on said straight external of said straight portion in the vertical and horizontal directions and vice versa.

16. The LED module according to claim 15, wherein said switch device is installed on an external surface of the LED module.

17. The LED module according to claim 15, further comprising a signal cable extending outward from the LED module, said switch device being installed on said signal cable.

18. The LED module according to claim 15, further comprising a first short-distance wireless communication module, said switch device being mounted on a remote control, which includes a second short-distance wireless communication module and a processor, activation of said switch device causing said processor to generate a switch on/off command for transmitting to said first short-distance wireless communication module on the LED module through said second short-distance wireless communication module.

\* \* \* \* \*